(12) United States Patent
Faguet

(10) Patent No.: US 7,771,790 B2
(45) Date of Patent: *Aug. 10, 2010

(54) METHOD AND SYSTEM FOR FABRICATING A NANO-STRUCTURE

(75) Inventor: Jacques Faguet, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 726 days.

This patent is subject to a terminal disclaimer.

(21) Appl. No.: 11/468,526

(22) Filed: Aug. 30, 2006

(65) Prior Publication Data

US 2008/0057192 A1    Mar. 6, 2008

(51) Int. Cl.
*C23C 16/00* (2006.01)
*B44C 1/22* (2006.01)
*B05D 7/22* (2006.01)

(52) U.S. Cl. ............... 427/248.1; 216/2; 216/41; 427/230; 427/237; 438/750

(58) Field of Classification Search .......... 216/2, 216/41, 99, 100; 438/750
See application file for complete search history.

(56) References Cited

U.S. PATENT DOCUMENTS

| 5,427,975 | A | * | 6/1995 | Sparks et al. | ............... 438/52 |
| 6,093,330 | A | * | 7/2000 | Chong et al. | ............... 216/2 |
| 6,719,886 | B2 | | 4/2004 | Drewery | |
| 6,987,059 | B1 | | 1/2006 | Burke et al. | |
| 2003/0209314 | A1 | | 11/2003 | Guo et al. | |
| 2004/0197843 | A1 | | 10/2004 | Chou et al. | |
| 2005/0095806 | A1 | * | 5/2005 | Nevin et al. | ............... 438/424 |
| 2005/0190241 | A1 | | 9/2005 | Lee et al. | |
| 2005/0211545 | A1 | | 9/2005 | Cerio et al. | |
| 2006/0094221 | A1 | | 5/2006 | Soda et al. | |
| 2006/0213764 | A1 | | 9/2006 | Cerio | |
| 2006/0228816 | A1 | * | 10/2006 | Lu et al. | ............... 438/7 |

FOREIGN PATENT DOCUMENTS

WO      WO 03/010289        2/2003

OTHER PUBLICATIONS

Office Action issued in copending related U.S. Appl. No. 11/468,566, mailed Mar. 25, 2008.
Notice of Allowance issued in U.S. Appl. No. 11/468,566 mailed Oct. 14, 2008.
International Search Report issued in Application No. PCT/US2007/072322, mailed Nov. 3, 2008.
Written Opinion issued in Application No. PCT/US2007/072322, mailed Nov. 3, 2008.

* cited by examiner

*Primary Examiner*—Shamim Ahmed

(57) ABSTRACT

A method and system for fabricating nano-scale structures, such as channels (i.e., nano-channels) or vias (i.e., nano-vias). An open nano-structure, is formed in a substrate. Thereafter, a conformal material film may be deposited within and over the nano-structure using an optional first deposition process condition, and then the open nano-structure is closed off to form a closed nano-scale structure using a second deposition process condition, including one or more process steps.

33 Claims, 13 Drawing Sheets

METHOD AND SYSTEM FOR FABRICATING A NANO-STRUCTURE

CROSS-REFERENCE TO RELATED APPLICATIONS

This application is related to U.S. patent application Ser. No. 11/468,566, entitled "Method for Fabricating Nano-Structures", filed on even date herewith. The entire contents of this application are herein incorporated by reference in their entirety.

BACKGROUND OF THE INVENTION

1. Field of the Invention

The present invention relates to a closed structure and a method for fabricating the closed structure, and more particularly to a closed fluidic structure, such as a closed fluidic channel, and a method of fabricating a closed fluidic structure in a substrate using vapor deposition techniques.

2. Description of Related Art

Nano-structures, such as nano-fluidic devices and nano-electro-mechanical systems (NEMs) (i.e., fluidic devices or electro-mechanical devices having cross-sectional dimensions fabricated at the nanometer scale), are an emerging technological field having significant commercial potential for the future. Nano-structures, including nano-fluidic devices having arrays of nano-scale channels, are contemplated for use in molecular/biological sensors, biological separations and catalysis, single cell analysis, single molecule manipulation, DNA stretching, nano-scale fluidic transport, and high throughput macro-molecular analysis.

As an example, an array of nano-scale channels may facilitate the manipulation and analysis of bio-molecules, including DNA (having a persistence length of approximately 50 nm), proteins, etc. These arrays of nano-scale channels may possess channels of varying sizes, wherein each size, e.g., the cross-sectional dimensions of the channel, is selected for the passage of a specific molecular cross-section. Therefore, a pre-determined arrangement of the array of channels of varying size can permit the filtering of bio-molecules of different size.

In yet another example, nano-fluidic devices are contemplated for conductive-convective cooling of micro- and/or nano-electronic devices. Due to the continuing reduction in electronic structure size and the increasing number density of devices on substrate real estate, the density of dissipated power increases, while the need to remove this heat becomes increasingly important in order to preserve the operating characteristics of the electronic device.

SUMMARY OF THE INVENTION

The present invention relates to a nano-structure, and a method and system for fabricating a closed nano-structure.

According to one embodiment, an open nano-structure is formed on a substrate and the nano-structure is closed using a vapor deposition technique.

According to another embodiment, the open nano-structure formed in the substrate comprises a trench or via having a characteristic dimension less than or equal to approximately 500 nanometers (nm). In yet another embodiment, the characteristic dimension is less than or equal to approximately 200 nm.

According to another embodiment, a nano-fluidic structure is formed on a substrate having precise cross-sectional dimensions and a method is described for forming the nano-fluidic structure.

Still another embodiment of the invention is to provide a method of forming an interconnection of two or more nano-fluidic structures on a substrate.

These and/or other embodiments of the invention may be provided by a method of fabricating a closed structure on a substrate, in which an open feature is formed within the substrate. The open feature extends into the substrate from an opening at an upper surface thereof and has a nominal cross-sectional shape characterized by an initial lateral dimension that is less than or equal to approximately 500 nanometers (nm). The opening to the open feature is closed in order to create a closed feature in the substrate by using one or more vapor deposition processes to deposit material across the opening thereby forming a material membrane closing the opening to the open structure. The material deposited across the opening and within the open feature is such that a resultant cross-sectional shape of the closed feature is substantially the same as the nominal cross-sectional shape.

DETAILED DESCRIPTION OF SEVERAL EMBODIMENTS

In the following description, in order to facilitate a thorough understanding of the invention and for purposes of explanation and not limitation, specific details are set forth, such as a particular geometry of a nano-scale structure having an open or closed feature and descriptions of various processes for forming the open or closed structure. However, it should be understood that the invention may be practiced in other embodiments that depart from these specific details.

Figure 1A:
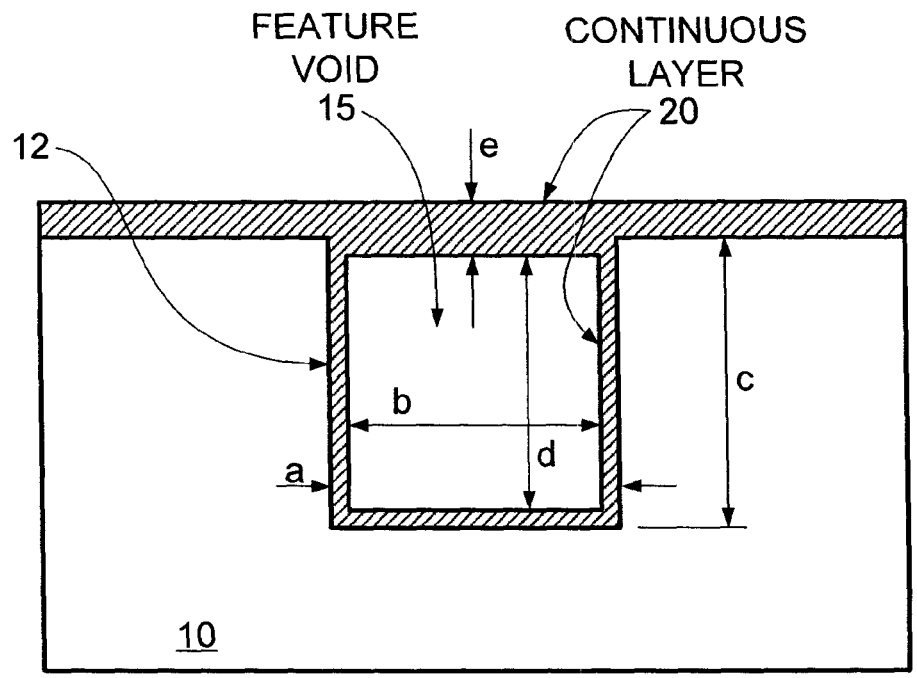
FIG. 1A illustrates a method of forming a nano-scale structure according to one embodiment.
Figure 1B:
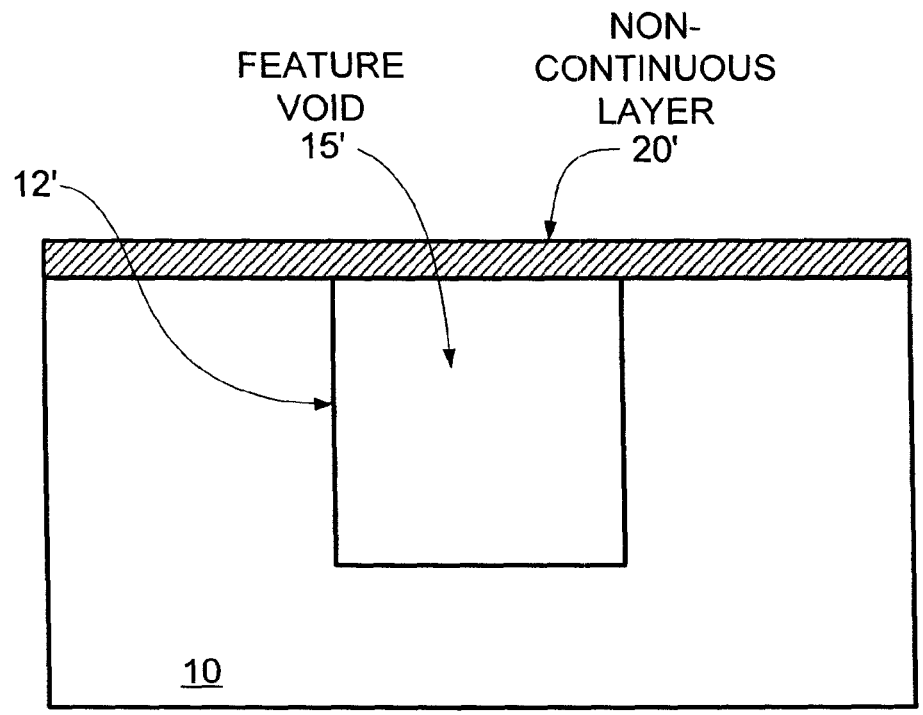
FIG. 1B illustrates a method of forming a nano-scale structure according to another embodiment.
Figure 3:
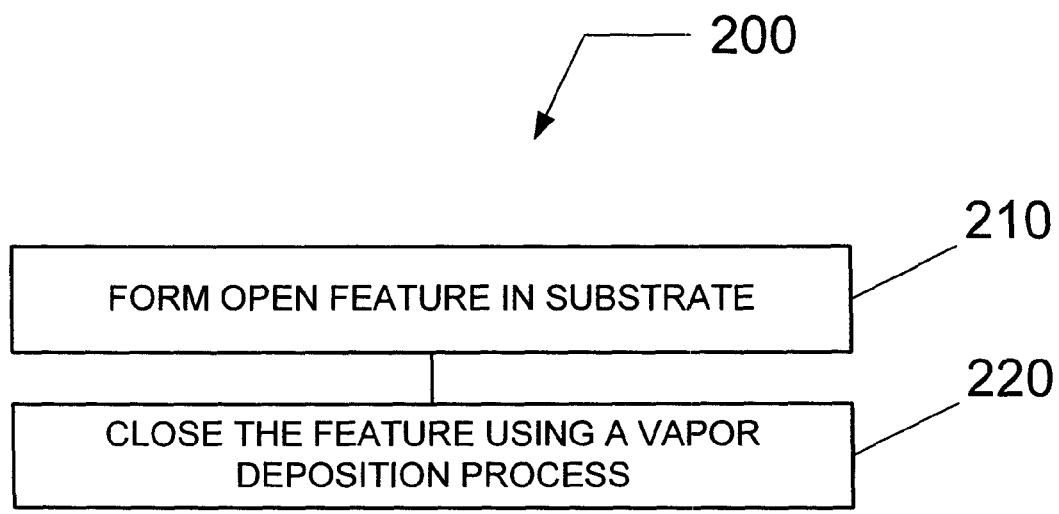
FIG. 3 illustrates a flow chart of a method for forming a nano-scale structure on a substrate according to an embodiment.

Referring now to the drawings, wherein like reference numerals designate identical or corresponding parts throughout the several views, FIGS. 1A and 1B, and FIG. 3 illustrate a method for forming a nano-scale structure according to several embodiments. As shown in FIG. 3, the method is illustrated in a flow chart 200, wherein the method comprises forming an open feature in a substrate in at 210, and using vapor deposition techniques to close the open feature in at 220 while preserving the cross-sectional shape, or the internal critical dimension(s) (CD), or both the shape and CDs of the (e.g., nano-scale) feature cross-section.

According to one embodiment, the use of vapor deposition techniques to close the open feature can include the formation of a homogeneous (e.g., nano-scale) closed feature, whereby the deposited material forms a continuous (vapor deposited) material boundary enclosing the feature void (e.g., channel void or via void); see FIG. 1A. According to another embodiment, the use of vapor deposition techniques to close the open feature can include the formation of a heterogeneous (e.g., nano-scale) closed feature, whereby the deposited material forms only a membrane (or capping) layer to close the open end of the open feature without forming a continuous (vapor deposited) material boundary (i.e., non-continuous material boundary) enclosing the feature void (e.g., channel void or via void); see FIG. 1B.

For the heterogeneous closed feature, when forming a thin material membrane across an open feature, material can be deposited within the open feature on the feature sidewalls, or the bottom, or both. In either the case of homogeneous closed features or heterogeneous closed features, such deposition can be controlled in order to prepare closed features having desired internal dimensions so that the practical use of such features as, for example, nano-fluidic arrays in heat transfer systems for electronic devices, bio-molecule filtering systems, etc., can be realized. As will be described, vapor deposition processes are described that can preserve one or more of the internal dimensions or shape or both when closing the open feature (i.e., forming the thin material membrane).

As illustrated in FIGS. 1A and 1B, an open feature 12 (12') is formed in a substrate 10. The open feature 12 (12') extends into the substrate 10 from an opening at an upper surface thereof and comprises a nominal cross-sectional shape characterized by an initial lateral dimension. For example, the open feature 12 (12') can include an open channel or trench, or alternatively, the open feature 12 (12') can include a via or hole.

The open feature 12 (12') may comprise a substantially rectangular cross-sectional shape, such as the square cross-section illustrated in FIGS. 1A and 1B, or it may comprise a more circular, rectangular or trapezoidal cross-section, for example. The cross-sectional shape may be of any shape that can be achieved using conventional techniques known to those skilled in the art of micro/nano-scale etching, imprinting, milling, etc. The initial lateral dimension can include a width, or maximum lateral extent of the open feature 12 (12') in substrate 10. Alternatively, the initial lateral dimension can include a diameter. Additionally, the nominal cross-sectional shape can be characterized by an initial vertical dimension. The initial vertical dimension may include a depth, or maximum vertical extent of the open feature 12 (12') into substrate 10.

The open feature 12 (12') may be formed using any technique, such as an etching process, a milling process, or a (nano-)imprint lithography process, or a combination thereof. The etching process can include a dry etching process with or without plasma, or a wet etching process. For example, when an anisotropic feature (i.e., a substantially rectangular cross-sectional shape) is desired, a dry plasma etching process, such as a reactive ion etching process, may be used. Alternatively, for example, when an isotropic feature is desired, a wet etching process may be used.

As illustrated in FIG. 1A for a homogeneous closed feature, the initial lateral dimension of the open feature can be characterized by width (a), and the initial vertical dimension of the open feature can be characterized by depth (c). In order to facilitate the use of vapor deposition techniques to form a (homogeneous or heterogeneous, i.e., FIG. 1A or 1B) closed feature, the initial lateral dimension (a) of the open feature 12 (12') is selected to be less than or equal to approximately 500 nanometers (nm), and desirably, it is selected to be less than or equal to approximately 200 nm. However, features of lateral dimensions greater than approximately 500 nm can be closed using vapor deposition techniques and will be discussed later.

Additionally, for instance, the initial vertical dimension of the open feature 12 (12') may be of any dimension suitable for the specific application. The initial vertical dimension may be very small, on the order of several nanometers (nm), or it may be larger on the order of several microns and greater.

Once the open feature 12 (12') is formed in substrate 10, it may be closed using one or more vapor deposition processes. In one embodiment, as shown in FIG. 1A, a continuous layer 20 of material is formed, thus creating feature void 15. Alternatively, in another embodiment, a non-continuous layer 20' is formed, thus creating feature void 15'. Any vapor deposition process may be employed including one or more of physical vapor deposition (PVD), ionized PVD (iPVD), ionized vapor deposition, chemical vapor deposition (CVD), plasma enhanced CVD (PECVD), atomic layer deposition (ALD), or plasma enhanced ALD (PEALD), or a combination of two or more thereof. Furthermore, the vapor deposition processes may comprise multiple steps configured to adjust the net amount of deposition on various surfaces of the substrate by balancing deposition and etching mechanisms. Moreover, the amount of net deposition on the flat-field or any of the feature surfaces, such as the sidewalls or bottom, can be adjusted by tailoring the vapor deposition processes accordingly (to be discussed below).

Ionized deposition processes or ionized PVD processes can be utilized to close the open feature, thus forming the closed feature. In these vapor deposition techniques for forming the material membrane closing the open feature, the adatom (i.e., material to be deposited), or a fraction of the adatom, is ionized. The adatom may be introduced by sputtering, or it may be introduced in vapor form using other techniques, including electron beam heating, laser heating, radio frequency (RF) induction heating, resistive heating, etc.

The material that is selected for forming the homogeneous or heterogeneous closed feature may be (electrically) conductive, semi-conductive or non-conductive. Additionally, a material may be selected for its reactive or non-reactive properties. For example, the material may comprise a metal (M), metal oxide ($M_xO_y$), metal nitride ($M_xN_y$), metal silicide ($M_xSi_y$), metal silicate ($M_xSi_yO_z$), metal oxynitride ($M_xO_yN_z$), etc. Additionally, for example, a metal may be selected for its reactive or catalytic properties.

For example, as illustrated in FIG. 1A, once the feature is closed, the internal lateral dimension of the closed feature can be characterized by width (b), and the internal vertical dimension of the closed feature can be characterized by depth (d). Additionally, for example, the thickness of the vapor deposited membrane to close the feature can be characterized by thickness (e).

The vapor deposition processes may be performed such that the cross-sectional shape of the feature void is geometrically similar to the nominal shape of the open feature 12. For instance, the final lateral dimension (b) can be greater than or equal to approximately 50% of the initial lateral dimension (a), or the final lateral dimension (b) can be greater than or equal to approximately 80% of the initial lateral dimension (a). Alternatively, the final lateral dimension (b) can be greater than or equal to approximately 90% of the initial lateral dimension (a). Additionally, for instance, the final vertical dimension (d) can be greater than or equal to approximately 50% of the initial vertical dimension (c), or the final vertical dimension (d) can be greater than or equal to approximately 80% of the initial vertical dimension (c). Alternatively, the final vertical dimension (d) can be greater than or equal to approximately 90% of the initial vertical dimension (c). Furthermore, for instance, the thickness (e) of membrane closing the open feature can range from approximately 1 nm to approximately 1000 nm, or the thickness can range from approximately 5 nm to approximately 50 nm.

Figure 4:
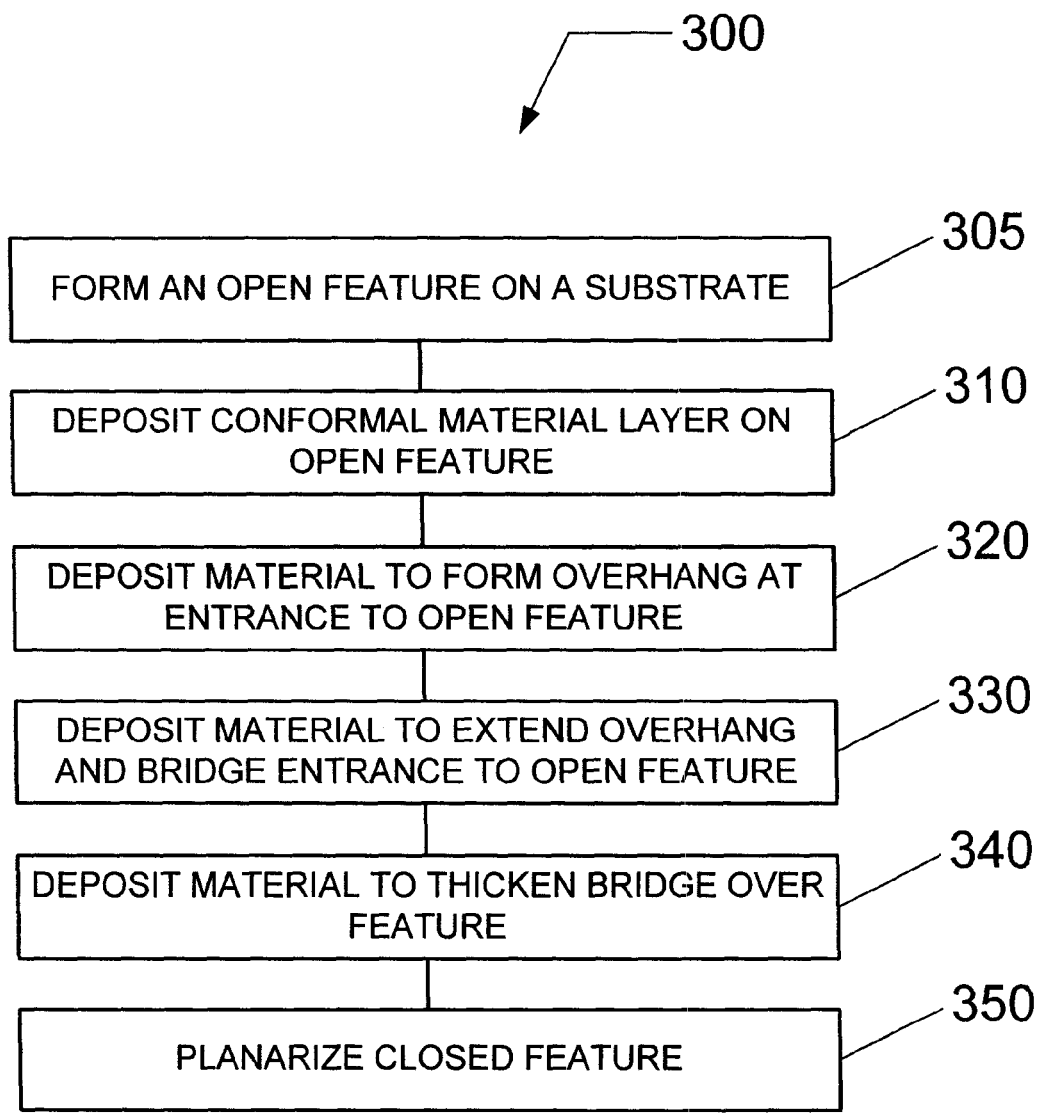
FIG. 4 illustrates a flow chart of a method for forming a nano-scale structure on a substrate according to another embodiment.

Referring now to FIGS. 2A through 2G and FIG. 4, a method is described for closing an open feature on a substrate according to another embodiment. As shown in FIG. 4, the method is illustrated in a flow chart 300, wherein the method comprises forming an open feature 110 in a substrate 100 at 305. The open feature 110 may be formed using any of the techniques described above.

Figure 2A:
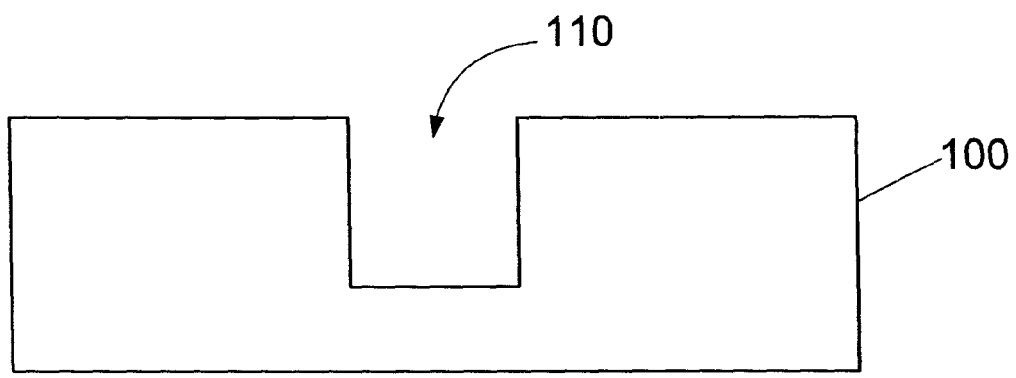
FIGS. 2A through 2G depict a method of forming a nano-scale structure on a substrate according to yet another embodiment.
Figure 2B:
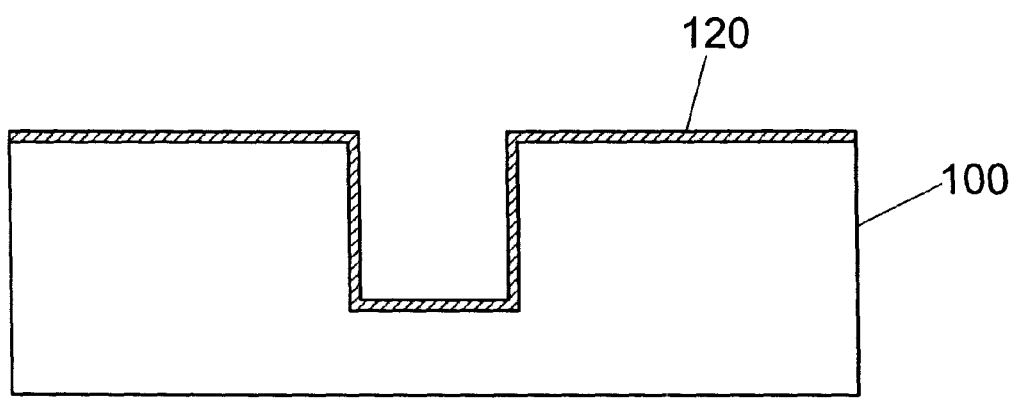

At 310 and as shown in FIG. 2B, an optional conformal material layer 120 is deposited on the open feature 110. Once the feature 110 (with conformal material layer 120) is closed, a homogeneous closed feature is formed as in FIG. 1A. Alternatively, once the feature 110 (without conformal material layer 120) is closed, a heterogeneous closed feature may be formed as in FIG. 1B. The conformal material layer 120 may be formed using any of the vapor deposition techniques described above. For example, an ALD process, a CVD process, or an ionized vapor deposition process, such as an ionized PVD process, may be utilized to form the conformal material layer 120. Additionally, for example, when using an iPVD process, a process condition creating a high ratio of adatom ion population to total adatom population (i.e., approaching unity) with low ion energy (e.g., low substrate bias), such that etching of deposited adatom is decreased or substantially absent, may be utilized to produce a conformal thin film. An exemplary set of process conditions will be described in greater detail later for an iPVD process.

Figure 2C:
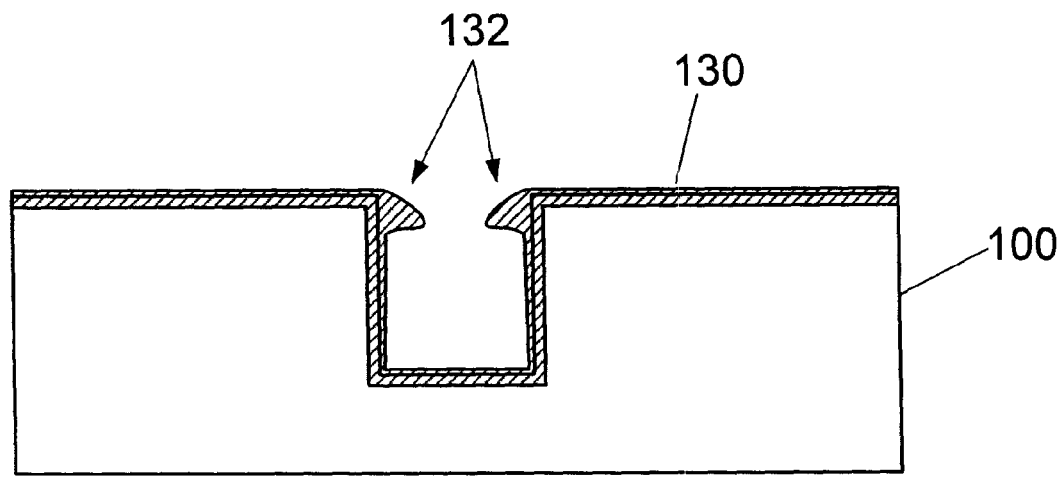
Figure 2D:
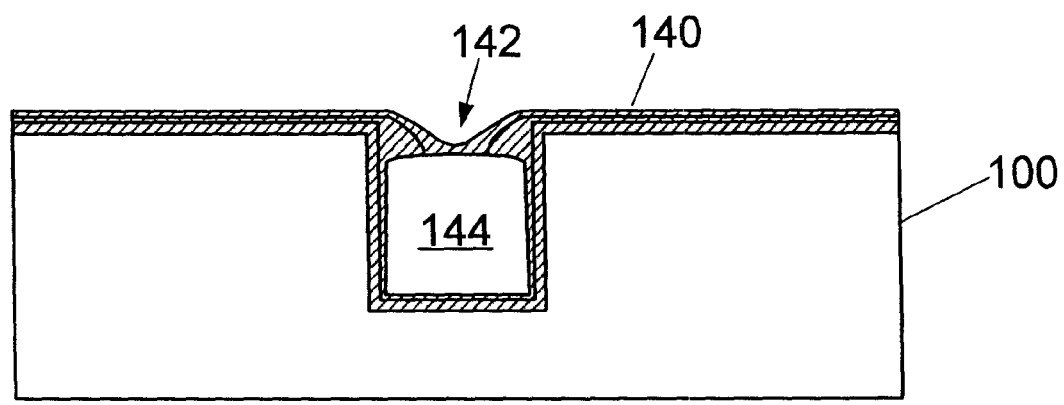

At 320 and as shown in FIG. 2C, an overhang material layer 130 is deposited to form an overhang 132 at the opening to the open feature 110. At 330 and as shown in FIG. 2D, a membrane layer 140 is deposited to form a bridge 142 across the opening to the open feature 110, thus closing off an internal void 144. For example, an ionized vapor deposition process, such as an ionized PVD process, may be utilized to form the overhang material layer 130 or the membrane layer 140 or both. Additionally, when using an iPVD process, a process condition creating a relatively lower ratio of adatom ion population to total adatom population (e.g., increased total adatom population with substantially the same adatom ion population) with a relatively higher ion energy (e.g., high substrate bias), such that etching of deposited adatom is increased or substantially near a no net deposition condition in the flat-field, may be utilized to produce the overhang layer 130 or the membrane layer 140 or both. An exemplary set of process conditions will be described in greater detail later for an iPVD process.

The processes illustrated at 320 and 330 in FIG. 4 may be performed at the same time using the same process conditions (i.e., process recipe), or they may be performed separately using more than one set of process conditions. For example, when the process conditions are different for the formation of the overhang layer 130 and the formation of the membrane layer 140, the total adatom population created for forming the overhang layer 130 may be decreased during the creation of the membrane layer 140.

Figure 2E:
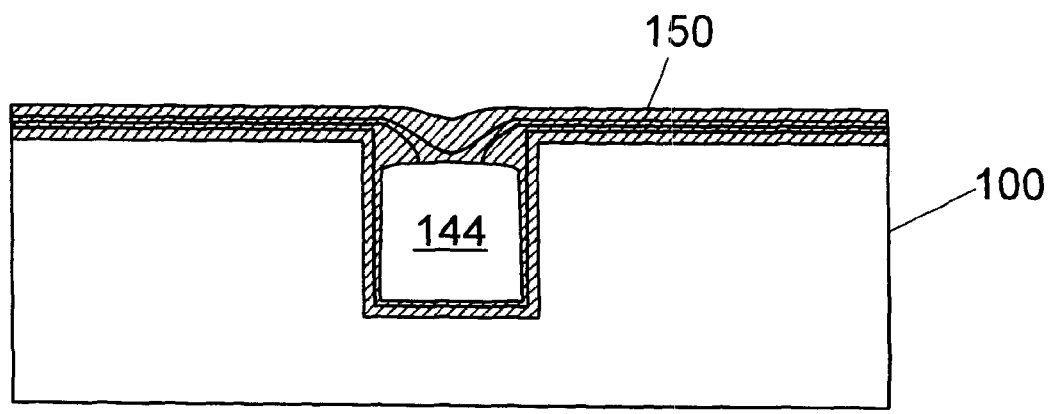

At 340 and as shown in FIG. 2E, an optional thickening material layer 150 is deposited. For example, an ALD process, a CVD process, or an ionized vapor deposition process, such as an ionized PVD process, may be utilized to form the thickening material layer 150. An exemplary set of process conditions will be described in greater detail later for an iPVD process.

Figure 2F:
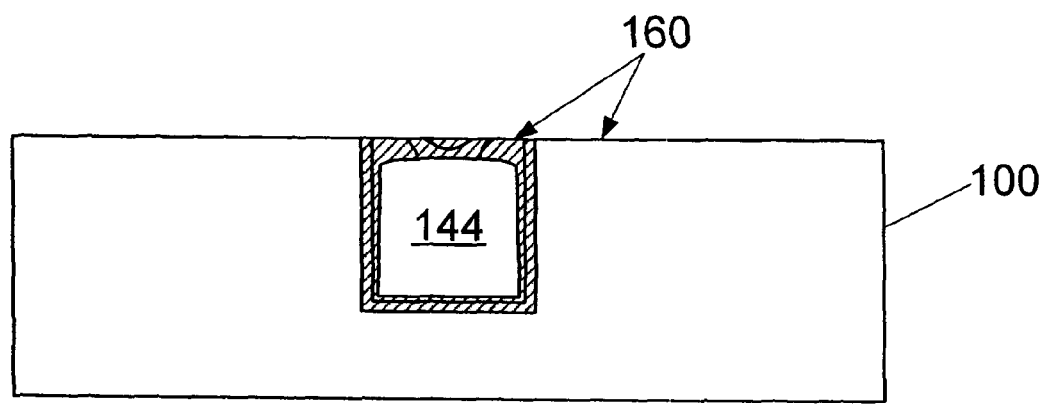

At 350 and as shown in FIG. 2F, the material deposited on substrate 100 may be planarized to form a planar surface 160. The planarization process may include a chemical-mechanical polishing (CMP) process.

Figure 2G:
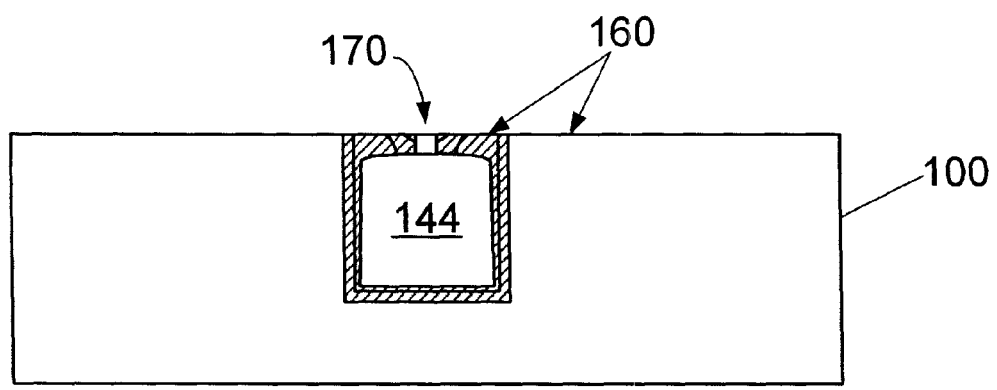

Furthermore, as illustrated in FIG. 2G, an opening 170 may, optionally, be formed in the closed feature. The opening may, for example, be formed using an etching or milling process. Additionally, the opening may, for example, include a variety of cross-sectional shapes, including circular, elliptical, rectangular, square, or any shape that can be patterned using, for instance, a photo-lithography process.

Figure 5A:
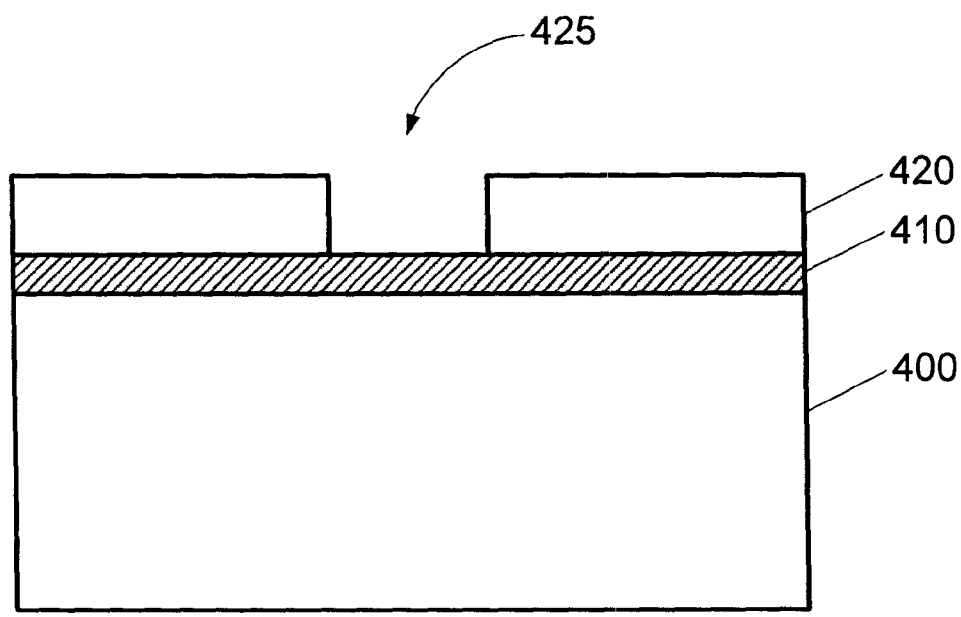
FIGS. 5A through 5E depict a method for forming a nano-scale structure in a substrate according to yet another embodiment.
Figure 5B:
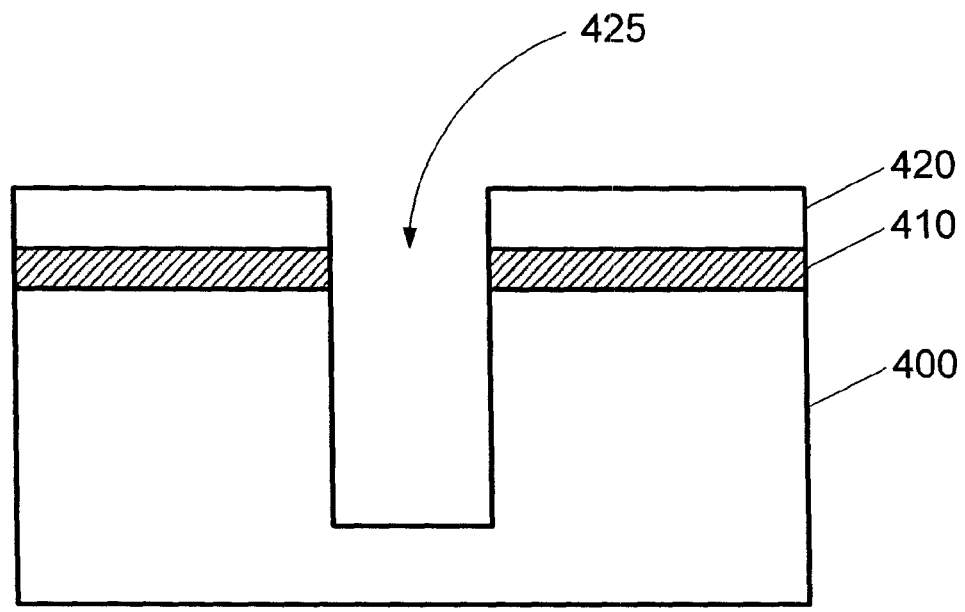
Figure 5C:
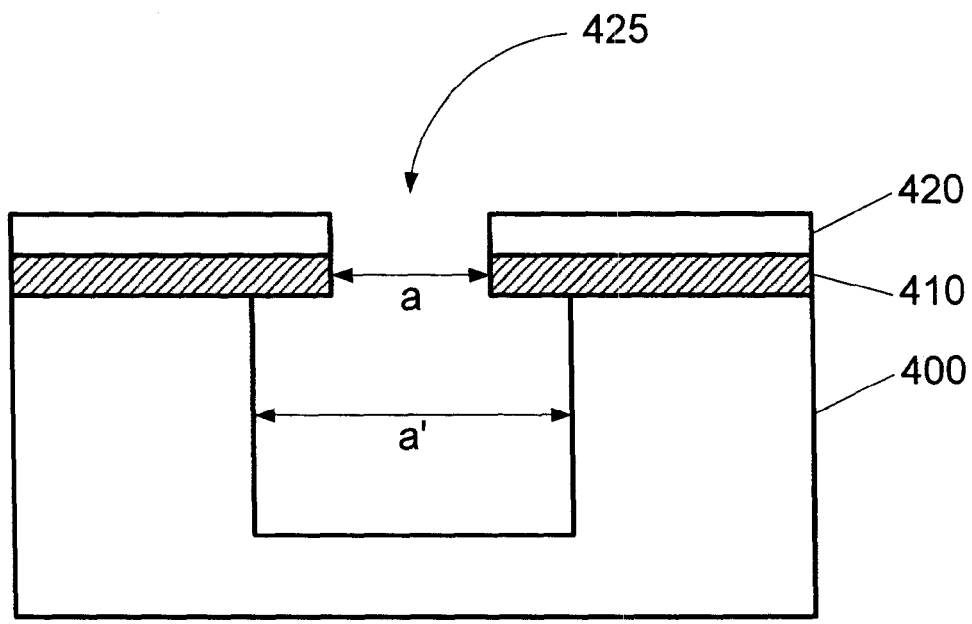

According to yet another embodiment, FIGS. 5A through 5D illustrate a method for forming a closed feature having an internal lateral dimension greater than approximately 500 nm. As shown in FIG. 5A, a substrate 400 includes a cap layer 410 and a mask layer 420 having pattern 425 formed thereon. Cap layer 410 comprises a material composition sufficiently different than said substrate 400 such that one material may be selectively etched relative to the other material. As described above, the lateral critical dimension (i.e., width (a) of the opening in mask layer 420, as shown in FIG. 5C) of pattern 425 is selected to be approximately 500 nm or less.

As shown in FIG. 5B, the pattern 425 is transferred to the cap layer 410 and the substrate 400 using one or more etching processes, such as one or more anisotropic dry plasma etching processes. Thereafter, as illustrated in FIG. 5C, a selective etching process is performed in order to laterally etch substrate 400 in order to increase the nominal lateral critical dimension (a) of pattern 425 to an expanded lateral critical dimension (a').

Figure 5D:
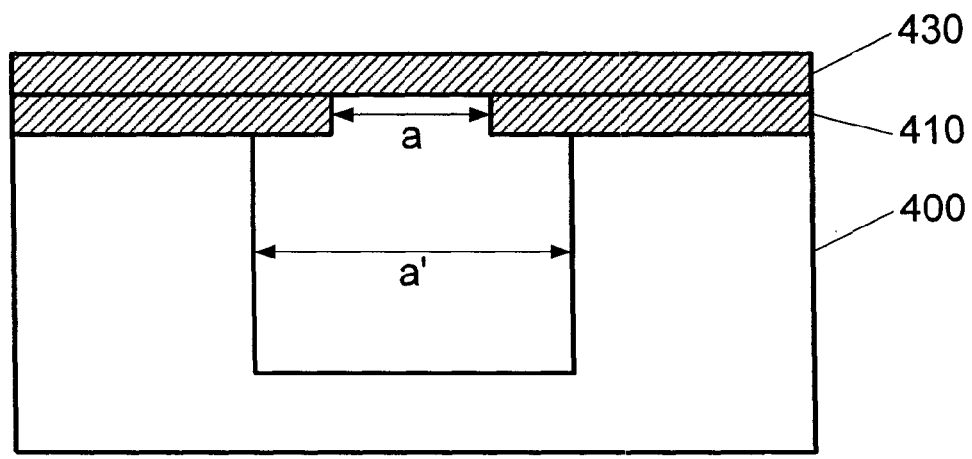

Once the expanded open feature is formed in substrate 400 having a width (a') and an opening (a), any remaining mask layer 420 can be removed and one or more vapor deposition processes can be executed to form membrane layer 430 to close the open feature as illustrated in FIG. 5D. When the material composition of membrane layer 430 is different than the material composition of cap layer 410, the closure mechanism may be similar to that illustrated in FIG. 5D, i.e., material deposited in the flat-field.

Figure 5E:
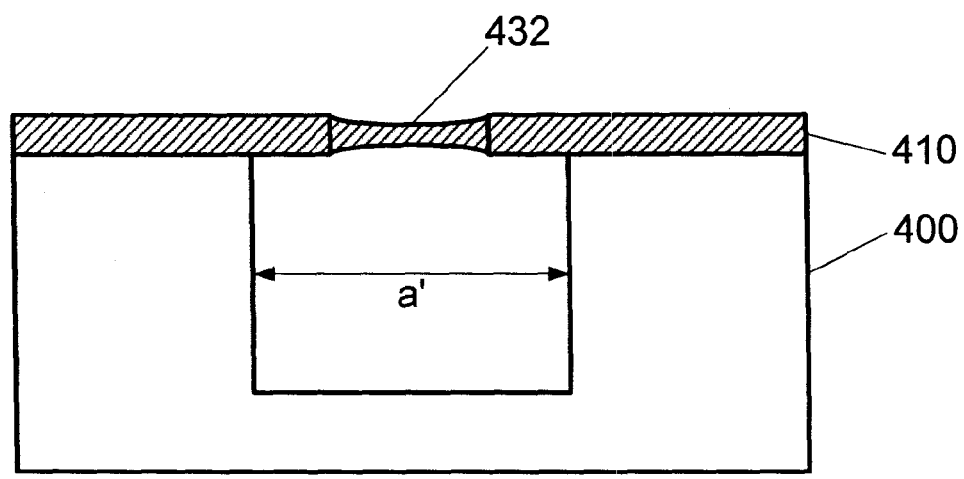

Alternatively, as illustrated in FIG. 5E, the open feature may be closed by depositing a bridge layer 432. When the material composition of membrane layer 430 is the same as the material composition of cap layer 410, the closure mechanism may be similar to that illustrated in FIG. 5E, i.e., less material deposited in the flat-field.

Figure 8:
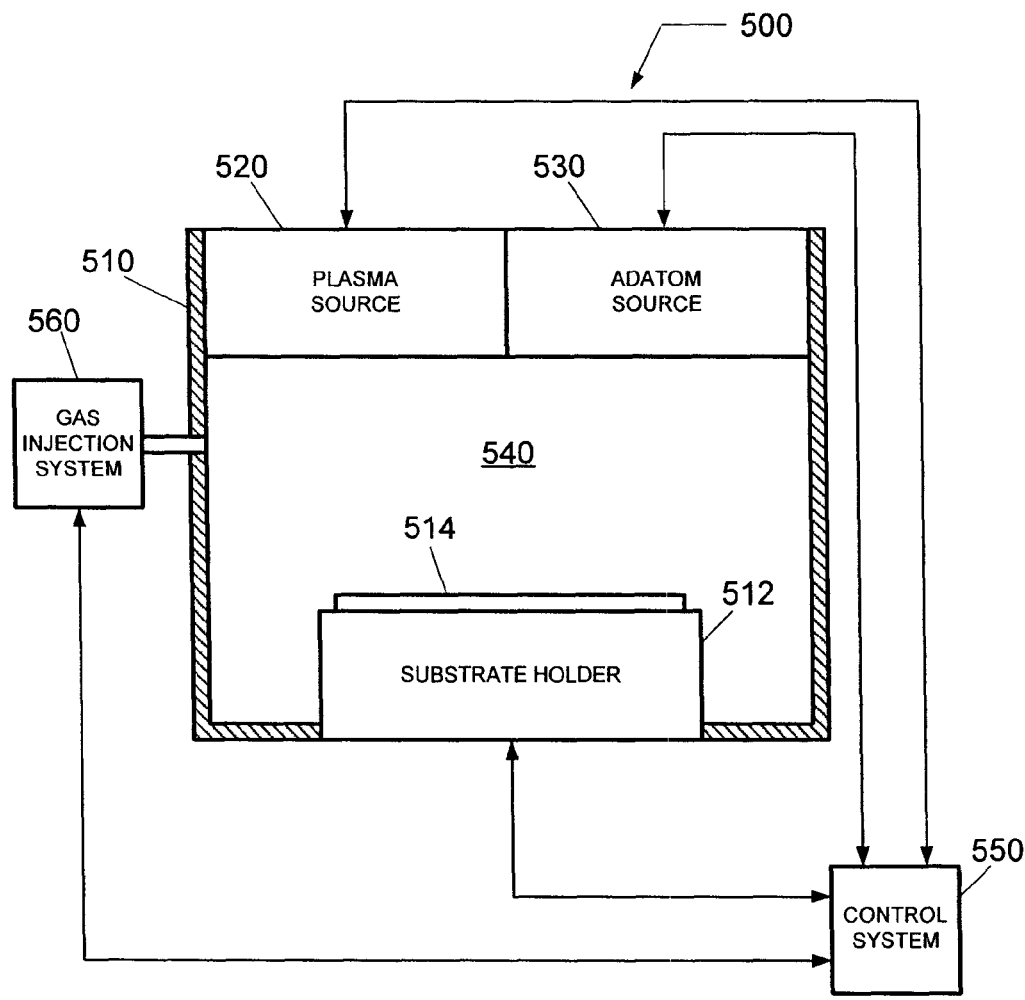
FIG. 8 presents a deposition system for forming a nano-scale structure according to an embodiment.

Referring now to FIG. 8, a deposition system 500 is presented according to an embodiment of the invention. Deposition system 500 includes a process chamber 510, and a substrate holder 512 coupled to the process chamber 510, and configured to support a substrate 514. Additionally, the deposition system 500 includes a plasma source 520 coupled to the process chamber 510 and configured to form plasma in process space 540 within process chamber 510. Additionally, the deposition system 500 includes an adatom source 530 coupled to the process chamber 510, and configured to introduce an adatom to process space 540 in process chamber 510.

The deposition system 500 can further comprise a gas injection system 560 coupled to the process chamber 510, and configured to introduce an inert gas, such as a noble gas (i.e., helium, argon, xenon, krypton, etc.), to the process space 540 in process chamber 510. Optionally, the deposition system 500 can further comprise a control system 550 coupled to the process chamber 510, the substrate holder 512, the plasma source 520, and the adatom source 530, wherein it may be configured to perform at least one of operating, adjusting, monitoring, or controlling the deposition system 500 according to, for example, a process recipe.

Referring still to FIG. 8, plasma source 520 can include an electrode coupled to a power source, such as a radio frequency (RF) generator, or a coil antenna coupled to a power source, such as a helical coil or other antenna coupled to an RF generator. For example, the plasma source 520 can include a capacitively coupled plasma (CCP) source, or an inductively coupled plasma source (ICP), or combination thereof. Additionally, for example, sub- and atmospheric ICP sources generate plasma with electron density of approximately $n_e \approx (1-4) \times 10^{14}$ cm$^{-3}$ and electron temperature of approximately ~0.2 eV to approximately 0.6 eV with 100% ionization of the adatom. Alternately, plasma source 120 can include a source capable of production of large area plasmas, such as electron beam sources with low electron temperature and electron density of approximately $n_e \approx 1.2 \times 10^{12}$ cm$^{-3}$ and above, as well as those capable of high density flat plasma production based on surface waves, helicon, or electron cyclotron resonance (ECR) plasma sources.

Adatom source 530 can, for example, be distributed about the perimeter of process chamber 510, from which source material adatoms enter process space 540. The source material can include conductive material, semi-conductive material, or non-conductive material. For example, a metal target may be utilized as a source of metal. The target can be biased using direct current (DC), or alternating current (AC) to generate adatoms (of source material) through a sputtering process. Alternately, other adatom sources, such as magnetrons, can be used. Pulsed laser deposition, high power pulsed magnetron sputtering, plasma assisted sputter techniques, etc., can be utilized. Additionally, the adatom source 530 can include a plurality of adatom sources. The plurality of adatom sources can be coupled to a power source. Alternately, each adatom source can be independently coupled to a separate power source. Alternately, the power can be alternatingly and sequentially coupled to the plurality of metal sources using one or more power sources.

Substrate holder 512 can include an electrode through which AC power, such as RF power, or DC power, or both is coupled to substrate 514. For example, substrate holder 512 can be electrically biased at an RF voltage via the transmission of RF power from an RF generator through an impedance match network to substrate holder 512. The RF bias can serve to heat electrons to form and maintain plasma. Alternatively, the RF bias can serve to affect the ion energy of ions incident on the upper surface of the substrate. A typical frequency for the RF bias can range from 0.1 MHz to 100 MHz. RF systems for plasma processing are well known to those skilled in the art. Alternately, RF power is applied to the substrate holder electrode at multiple frequencies. Furthermore, an impedance match network can serve to improve the transfer of RF power to plasma in the process chamber by reducing the reflected power. Match network topologies (e.g. L-type, π-type, T-type, etc.) and automatic control methods are well known to those skilled in the art.

Additionally, the substrate holder 512 can comprise an electrostatic clamping system (or mechanical clamping system) in order to electrically (or mechanically) clamp substrate 514 to the substrate holder 512. Furthermore, substrate holder 512 can, for example, further include a cooling system having a re-circulating coolant flow that receives heat from substrate holder 512 and transfers heat to a heat exchanger system (not shown), or when heating, transfers heat from the heat exchanger system. Moreover, a heat transfer gas can, for example, be delivered to the back-side of substrate 514 via a backside gas system to improve the gas-gap thermal conductance between substrate 514 and substrate holder 512. For instance, the heat transfer gas supplied to the back-side of substrate 512 can comprise an inert gas such as helium, argon, xenon, krypton, a process gas, or other gas such as oxygen, nitrogen, or hydrogen. Such a system can be utilized when temperature control of the substrate is required at elevated or reduced temperatures. For example, the backside gas system can comprise a multi-zone gas distribution system such as a two-zone (center-edge) system, wherein the back-side gas gap pressure can be independently varied between the center and the edge of substrate 514. In other embodiments, heating/cooling elements, such as resistive heating elements, or thermoelectric heaters/coolers can be included in the substrate holder 512, as well as the chamber wall of the process chamber 510.

Furthermore, control system 550 can include a microprocessor, memory, and a digital I/O port capable of generating control voltages sufficient to communicate and activate inputs to deposition system 500 as well as monitor outputs from deposition system 500. Moreover, control system 550 can be coupled to and can exchange information with process chamber 510, plasma source 520, distributed metal source 530, gas injection system 560, and vacuum pump system (not shown). For example, a program stored in the memory can be utilized to activate the inputs to the aforementioned components of deposition system 500 according to a process recipe in order to perform a deposition process. One example of control system 550 includes a DELL PRECISION WORKSTATION 610™, available from Dell Corporation, Austin, Tex.

However, the control system 550 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 550 may be locally located relative to the deposition system 500, or it may be remotely located relative to the deposition system 500. For example, the control system 550 may exchange data with the deposition system 500 using at least one of a direct connection, an intranet, the Internet and a wireless connection. The control system 550 may be coupled to an intranet at, for example, a customer site (i.e., a device maker, etc.), or it may be coupled to an intranet at, for example, a vendor site (i.e., an equipment manufacturer). Additionally, for example, the control system 550 may be coupled to the Internet. Furthermore, another computer (i.e., controller, server, etc.) may access, for example, the control system 550 to exchange data via a direct connection, an intranet, or the Internet or any combination thereof. As also would be appreciated by those skilled in the art, the control system 550 may exchange data with the deposition system 500 via a wireless connection.

According to one example, the deposition system 500 comprises an ionized physical vapor deposition (iPVD) system. Further details of an iPVD system are described in U.S. Pat. No. 6,719,886 B2, entitled "Method and apparatus for ionized physical vapor deposition", the entire contents are incorporated herein by reference in their entirety.

In the following discussion, a method of closing an open feature utilizing an ionized vapor deposition system is presented. For example, the ionized vapor deposition system may include an iPVD system configured to deposit metal-containing films, such as the iPVD system having various elements that is described in FIG. 8.

In an embodiment, the method of closing the open feature to form a closed feature comprises using a metal-containing target electrode. The target electrode comprises the material to be deposited (i.e., adatom) on the substrate. For example, when depositing copper (Cu) or tantalum (Ta), the target comprises Cu or Ta, respectively. An iPVD process parameter space can comprise: a chamber pressure of approximately 5 mTorr to approximately 1000 mTorr (desirably, the chamber pressure ranges from approximately 50 mTorr to approximately 100 mTorr); a noble gas (e.g., argon) flow rate (i.e., from gas injection system 560) ranging from approximately 50 to approximately 5000 sccm (alternatively, the flow rate ranges from approximately 200 sccm to approximately 600 sccm); a (direct current, DC) target power (i.e., adatom source 530 power in FIG. 8) ranging from approximately 5 kW to approximately 20 kW (alternatively, the DC power ranges from approximately 10 kW to approximately 15 kW); a plasma source radio frequency (RF) power (i.e., plasma source 520 power in FIG. 8) ranging from approximately 0.5 kW to approximately 10 kW (alternatively, the plasma source RF power ranges from approximately 4 kW to approximately 6 kW); a substrate holder RF bias (i.e., substrate holder 512 RF power) ranging up to approximately 2 kW (alternatively, the substrate holder RF bias power can range from approximately 100 W to approximately 1000 W); and a deposition time (for forming the closed feature) ranging from approximately 30 second to approximately 600 seconds (alternatively, the deposition time ranges from approximately 60 seconds to approximately 180 seconds).

Figure 6:
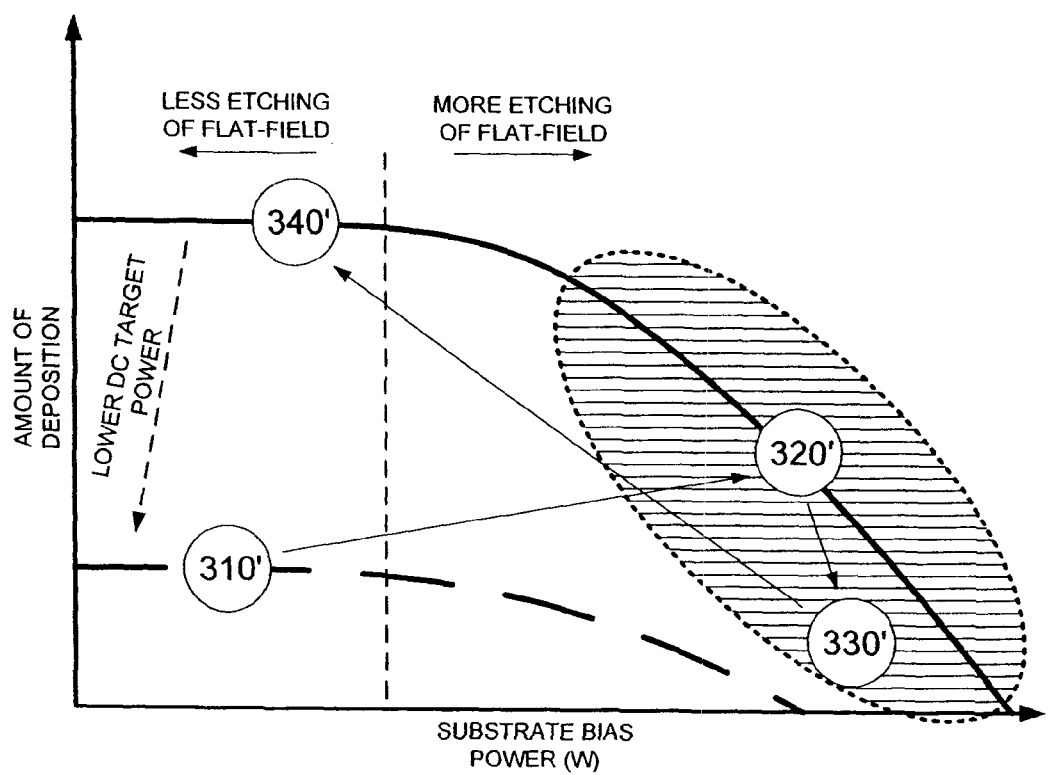
FIG. 6 provides an illustrative diagram for performing a vapor deposition process to close an open nano-scale structure.

Referring now to FIG. 6, an illustrative diagram is presented to provide an example of the method for closing an open feature as described in FIG. 4 using the system described in FIG. 8. The diagram presents an exemplary relationship between the amount of deposition on the substrate (e.g., in the flat-field) versus the substrate bias power (e.g., substrate holder RF power) on the abscissa and the target power (e.g., DC target power). For instance, as the substrate bias power is increased while holding other process parameters constant (e.g., pressure, plasma source power, etc.), the deposition amount remains substantially flat until it begins to decay once the ion energy for ions incident on the substrate is sufficiently high to sputter (or physically etch) adatom from the substrate. Eventually, at a very high substrate bias power, a no net deposition condition is reached (i.e., substantially zero net deposition in the flat-field). Additionally, as the target power decreases while holding other process parameters constant, the process condition shifts from the upper curve (solid line) to the lower curve (dashed line). By decreasing the target power and maintaining the same pressure and plasma source power (i.e., Ar ion population), the total adatom population is decreased, but with the same Ar ion ionization condition, the adatom ion population is increased and, hence, the ratio of the adatom ion population relative to the total adatom population is increased.

When performing the optional step 310 using an iPVD process, a process condition creating a high ratio of adatom ion population to total adatom population (i.e., approaching unity) with low ion energy (e.g., low substrate bias), such that etching of deposited adatom is decreased or substantially absent, may be utilized to produce a conformal thin film. For instance, in order to achieve a high ratio of adatom ion population to total adatom population, the (DC) target power can be reduced (e.g., less than or equal to approximately 10 kW) to reduce the amount of adatom produced by sputtering and the plasma source RF power (e.g., RF ICP power) can be increased to increase ionization, while the substrate bias power is decreased (e.g., less than or equal to approximately 500 W) to avoid operating in an etching regime, as illustrated by condition 310' in FIG. 6. The higher adatom ion population (relative to non-ionized adatom population) is beneficial for conformal deposition over substrate topography.

When performing the overhang step 320 or bridge step 330 or both using an iPVD process, a process condition creating a relatively lower ratio of adatom ion population to total adatom population (e.g., increased total adatom population with substantially the same adatom ion population) with a relatively higher ion energy (e.g., high substrate bias), such that etching of deposited adatom is increased or substantially near a no net deposition condition in the flat-field, may be utilized to produce the overhang layer 130 or the membrane layer 140 or both. For instance, the (DC) target power can be increased (e.g., greater than or equal to approximately 10 kW) to increase the amount of adatom produced by sputtering, the plasma source power (e.g., RF ICP power) can be increased (e.g., greater than or equal to approximately 5000 W) to increase ionization, while the substrate bias power is increased (e.g., greater than approximately 500 W) to operate in an etching regime, as illustrated by condition 320' and 330' in FIG. 6. As illustrated in FIG. 6, process conditions 320' and 330' may be different, and may, for example, lie within the cross-hatched region. Process condition 330' may be performed after process condition 320' at a higher bias power, where the bias powers of both process conditions are greater than approximately 500 W.

When performing the optional step 340 using an iPVD process, a process condition creating a high adatom ion population and high adatom population with low ion energy (e.g., low substrate bias), such that etching of deposited adatom is decreased or substantially absent, may be utilized to produce a thickening thin film. For instance, in order to achieve a high adatom ion population and a high total adatom population, the (DC) target power can be increased to increase the amount of adatom produced by sputtering and the plasma source RF power (e.g., RF ICP power) can be increased to increase ionization, while the substrate bias power is decreased (e.g., less than or equal to approximately 500 W) to avoid operating in an etching regime, as illustrated by condition 340' in FIG. 6.

Figure 7:
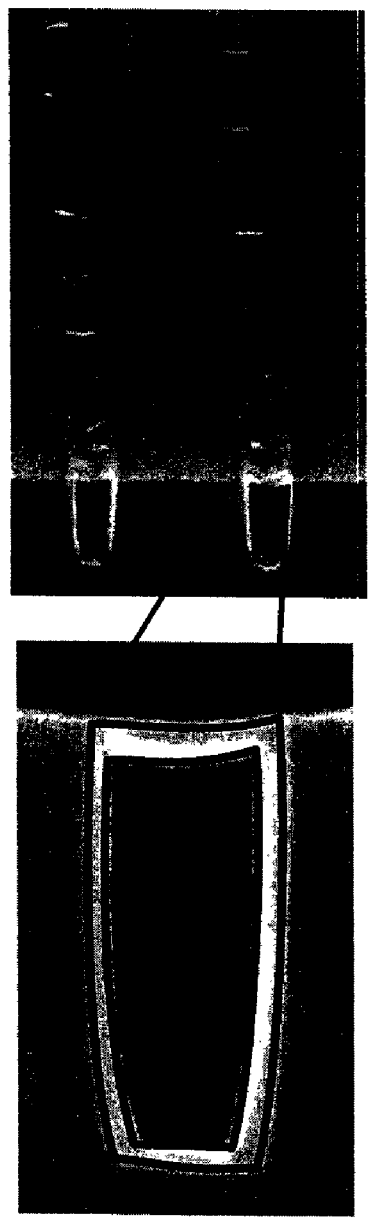
FIG. 7 presents an exemplary SEM photograph of a closed nano-scale structure.

As an example, a method of closing an open feature to form a closed feature utilizing an iPVD system such as the one described in FIG. 8 and in U.S. Pat. No. 6,719,886 B2 is presented. However, the methods discussed are not to be limited in scope by this exemplary presentation. FIG. 7 presents a SEM (scanning electron microscope) photograph of a closed trench formed by a copper (Cu) iPVD system utilizing the following exemplary process condition to simultaneously perform only steps 330 and 340 in FIG. 4: Chamber pressure=65 mTorr; Argon flow rate ~500 sccm; Target DC power ~10-12 kW; ICP (inductively coupled plasma) coil RF power=5-6 kW; Substrate RF bias power ~800-900 W; and Backside argon pressure=5 Torr; and a deposition time of approximately 120 seconds. As shown in FIG. 7, a homogeneous closed feature is produced having enclosure walls that are substantially uniform in thickness.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A method of fabricating a closed structure on a substrate, comprising:
   forming an open feature within said substrate, said open feature extending into said substrate from an opening at an upper surface thereof and having a nominal cross-sectional shape characterized by an initial lateral dimension that is less than or equal to approximately 500 nanometers (nm); and
   closing said opening to said open feature in order to create a closed feature in said substrate having a feature void formed therein by using one or more vapor deposition processes to deposit material across said opening thereby forming a material membrane closing said opening to said open feature, wherein said material deposited across said opening and within said open feature is such that a resultant cross-sectional shape of said feature void in said closed feature is substantially the same as said nominal cross-sectional shape.

2. The method of claim 1, further comprising:
   prior to said closing of said opening, depositing a conformal thin film as a liner for said open feature.

3. The method of claim 2, wherein the thickness of said material membrane is substantially the same as the thickness of said conformal thin film.

4. The method of claim 1, wherein said feature void comprises a final lateral dimension that is greater than or equal to approximately 80% of said initial lateral dimension.

5. The method of claim 1, wherein said feature void comprises a final lateral dimension that is greater than or equal to approximately 90% of said initial lateral dimension.

6. The method of claim 1, wherein said closing of said opening comprises closing said opening using one or more ionized vapor deposition processes.

7. The method of claim 6, wherein said closing of said opening comprises closing said opening using one or more ionized physical vapor deposition (iPVD) processes.

8. The method of claim 1, wherein said forming of said open feature comprises forming an open feature that is characterized by an initial lateral dimension less than or equal to approximately 200 nanometers (nm).

9. The method of claim 1, wherein said forming of said open feature comprises using an etching process, a nanoimprint lithography process, or an ion milling process, or a combination of two or more thereof.

10. The method of claim 9, wherein said etching process comprises using a wet etching process, a dry etching process, a dry plasma etching process, or a laser-assisted etching process, or a combination of two or more thereof.

11. The method of claim 1, wherein said forming of said open feature comprises forming an open channel having two sidewalls opposing one another and extending from said opening to a bottom of said open channel, and wherein said nominal cross-sectional shape includes a substantially rectangular cross-section and said initial lateral dimension is characterized by the distance between said opposing sidewalls of said open channel.

12. The method of claim 11, wherein said closing of said opening comprises forming said material membrane using an iPVD process.

13. The method of claim 1, wherein said forming of said open feature comprises forming a plurality of open channels, each open channel having two sidewalls opposing one another and extending from said opening to a bottom of said open channel, and wherein said nominal cross-sectional shape includes a substantially rectangular cross-section and said initial lateral dimension is characterized by the distance between said opposing sidewalls of said open channel.

14. The method of claim 1, wherein said forming of said open feature comprises forming an open channel characterized by a maximum lateral extent and a maximum vertical extent, and wherein said nominal cross-sectional shape includes a substantially non-rectangular cross-section and said initial lateral dimension is characterized by said maximum lateral extent of said open channel.

15. The method of claim 14, wherein said closing of said opening comprises forming said material membrane using an iPVD process.

16. The method of claim 1, wherein said forming of said open feature comprises forming an open via having a cylindrically shaped sidewall extending from said opening to a bottom of said open via, and wherein said nominal cross-sectional shape at a center of said open via includes a substantially rectangular cross-section and said initial lateral dimension is characterized by the diameter of said open via.

17. The method of claim 16, wherein said closing of said opening comprises forming said material membrane using an iPVD process.

18. The method of claim 1, wherein said closing of said open feature comprises:
   performing an optional first vapor deposition process to form a conformal material film on said substrate and within said open feature; and
   following said optional first vapor deposition process, performing a second vapor deposition process to form said material membrane across said opening to close said open feature.

19. The method of claim 18, wherein said performing of said first vapor deposition process comprises performing an iPVD process or an atomic layer deposition (ALD) process or both.

20. The method of claim 18, wherein said performing of said second vapor deposition process comprises performing an ionized vapor deposition process or an iPVD process.

21. The method of claim 1, further comprising:
   forming a through-hole in said closed feature.

22. The method of claim 21, wherein said through-hole comprises a circular orifice or a rectangular orifice.

23. The method of claim 1, wherein said closing of said open feature comprises:
   disposing said substrate on a substrate holder in an iPVD system, wherein said iPVD system is configured to: (a) provide bias power to said substrate holder, (b) provide source power to a plasma generation system configured to form plasma in said iPVD system, and (c) provide target power to a sputter target configured to introduce said material for said one or more vapor deposition processes; and
   performing a first iPVD process using a bias power setting for said bias power greater than approximately 500 W.

24. The method of claim 23, wherein said first iPVD process further includes using a target DC power setting greater than or equal to approximately 10 kW.

25. The method of claim 24, wherein said first iPVD process further comprises using a plasma source power setting, comprising a RF power greater than or equal to approximately 5000 W.

26. The method of claim 23, wherein said first iPVD process comprises performing a first process step at a first bias power greater than approximately 500 W and a second process step at a second bias power greater than approximately 500 W, and wherein said second bias power is greater than said first bias power.

27. The method of claim 23, further comprising:
prior to said first iPVD process, performing a second iPVD process using a low bias power setting for said bias power, wherein said low bias power setting comprises a power less than or equal to approximately 500 W.

28. The method of claim 27, wherein said second iPVD process further includes using a low target power setting, wherein said low target power setting comprises a DC power less than or equal to approximately 10 kW.

29. The method of claim 23, wherein said first iPVD process comprises one or more metal vapor deposition processes.

30. The method of claim 23, further comprising:
following said first iPVD process, performing a third iPVD process using another low bias power setting for said bias power, wherein said low bias power setting comprises a power level less than or equal to approximately 500 W.

31. The method of claim 23, further comprising:
planarizing said material on said substrate to the substrate surface.

32. A method of fabricating a closed nano-fluidic channel on a substrate, comprising:
forming an open channel within said substrate, said open channel extending into said substrate from an opening at an upper surface thereof and having a nominal cross-sectional shape characterized by an initial lateral dimension that is less than or equal to approximately 200 nanometers (nm);
applying a conformal thin film of material to said open channel in order to form a contiguous film on the surfaces of said open channel; and
closing said opening to said open channel in order to create a closed nano-fluidic channel in said substrate having a feature void formed therein by using one or more iPVD processes to deposit material across said opening thereby forming a material membrane closing said opening to said open channel, wherein said material deposited across said opening and within said open channel is such that a resultant cross-sectional shape of said feature void is substantially the same as said nominal cross-sectional shape.

33. A method of fabricating a closed nano-via on a substrate, comprising:
forming a substantially cylindrical open via within said substrate, said open via extending into said substrate from a substantially circular opening at an upper surface thereof and having a nominal cross-sectional shape characterized by an initial diameter that is less than or equal to approximately 200 nanometers (nm);
applying a conformal thin film of material to said open via in order to form a contiguous film on the surfaces of said open via; and
closing said opening to said open via in order to create a closed via in said substrate having a feature void formed therein by using one or more iPVD processes to deposit material across said opening thereby forming a material membrane closing said opening to said open via, wherein said material deposited across said opening and within said open via is such that a resultant cross-sectional shape of said feature void is substantially the same as said nominal cross-sectional shape.

* * * * *